US 7,895,498 B2
Feb. 22, 2011

(12) United States Patent
Miyata et al.

(54) APPARATUSES AND METHOD FOR ERROR CORRECTION CODING AND ERROR CORRECTION DECODING

(75) Inventors: Yoshikuni Miyata, Tokyo (JP); Hideo Yoshida, Tokyo (JP); Kazuhide Ouchi, Tokyo (JP); Katsuhiro Shimizu, Tokyo (JP); Tatsuya Kobayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 990 days.

(21) Appl. No.: 11/662,085

(22) PCT Filed: Sep. 9, 2004

(86) PCT No.: PCT/JP2004/013145

§ 371 (c)(1),
(2), (4) Date: Mar. 7, 2007

(87) PCT Pub. No.: WO2006/027838

PCT Pub. Date: Mar. 16, 2006

(65) Prior Publication Data

US 2008/0092009 A1    Apr. 17, 2008

(51) Int. Cl.
*H03M 13/00* (2006.01)
(52) U.S. Cl. .................................. 714/755
(58) Field of Classification Search .......... 714/761, 714/762, 752, 755
See application file for complete search history.

(56) References Cited

U.S. PATENT DOCUMENTS

| 6,035,434 | A | * | 3/2000 | Sazzad et al. ............... 714/776 |
| 6,498,936 | B1 | * | 12/2002 | Raith ........................ 455/466 |
| 6,658,605 | B1 | | 12/2003 | Yoshida et al. |
| 6,868,514 | B2 | * | 3/2005 | Kubo et al. ................. 714/755 |
| 2002/0122221 | A1 | | 9/2002 | Kubo et al. |
| 2002/0129313 | A1 | | 9/2002 | Kubo et al. |

FOREIGN PATENT DOCUMENTS

| JP | 2001-168734 A | 6/2001 |
| JP | 2001-332982 A | 11/2001 |

OTHER PUBLICATIONS

Lin, Shu et al., "Error Control Coding" Prentice-Hall, Inc., 1983, pp. 271-272.

* cited by examiner

*Primary Examiner*—Sam Rizk
(74) *Attorney, Agent, or Firm*—Birch, Stewart, Kolasch and Birch, LLP

(57) ABSTRACT

An error correction coding apparatus includes a first coding unit for coding a sequence data to be coded which includes information source data for each frame to generate an error correcting code word sequence including a parity sequences, and a first rearranging unit for rearranging elements of the error correcting code word sequences of a plurality of frames generated by the first coding unit. The first rearranging unit rearranges elements of the parity sequences included in the error correcting code word sequences. The first rearranging unit also rearranges elements of the error correcting code word sequences other than the parity sequences, within the error correcting code word sequences other than the parity sequences.

10 Claims, 10 Drawing Sheets

FIG. 3
(a)
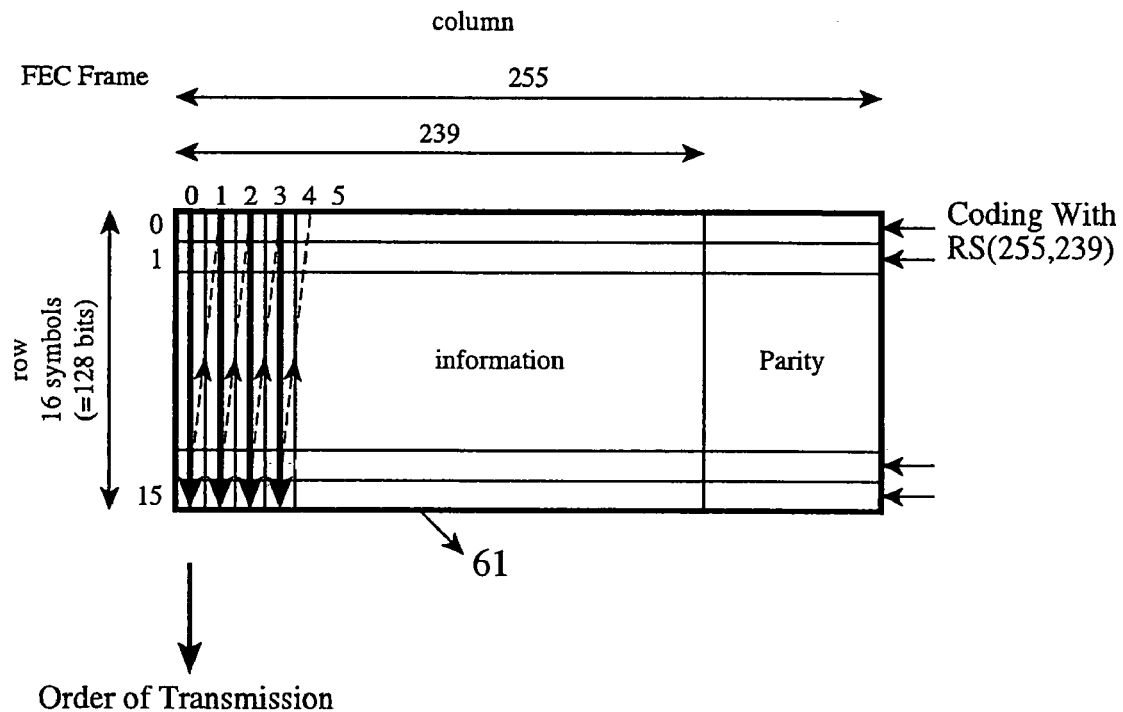
Order of Transmission
(b)
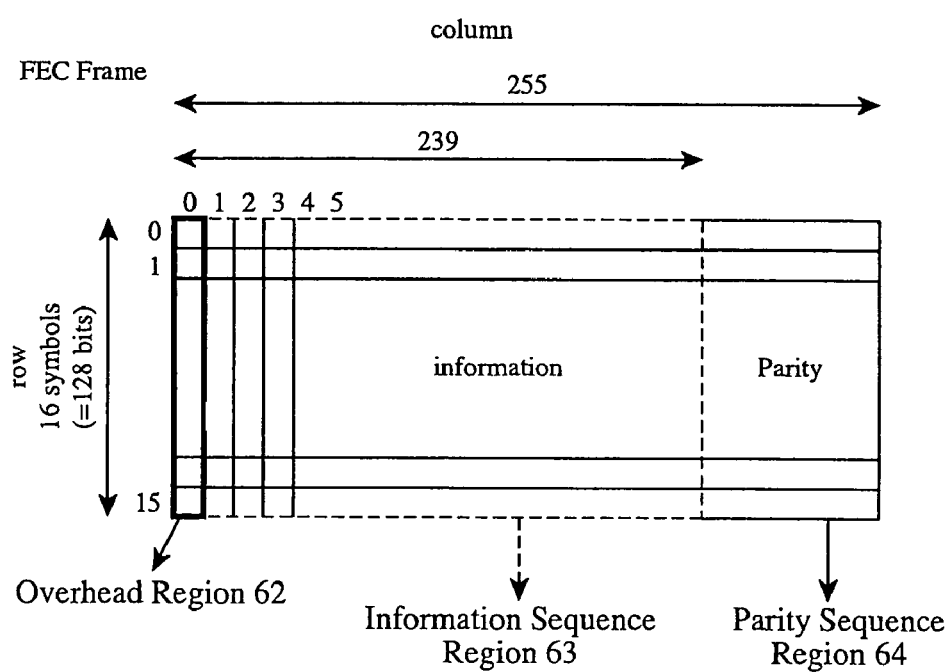

APPARATUSES AND METHOD FOR ERROR CORRECTION CODING AND ERROR CORRECTION DECODING

FIELD OF THE INVENTION

The present invention relates to an error correction coding apparatus and an error correction decoding apparatus for use in a lightwave transmission system.

BACKGROUND OF THE INVENTION

In accordance with an error correction coding method defined by ITU-T recommendation G.975 shown in patent reference 1, a transmit side converts a transmission information sequence inputted thereto in series order into 128 parallel information sequences using an FEC (Forward Error Correction) demultiplexing circuit. It can be considered that this conversion is interleaving processing having a depth of 128. An overhead is added to the 128 parallel information sequences, and a speed conversion corresponding to an FEC parity part is then performed on them.

After that, they are coded in units of 8 parallels high and 239 times width with RS (Reed Solomon) codes. This coding processing is carried out in such a manner that 16 coding processes are done in parallel, and a coded sequence having a 255-time width is generated. This whole code word sequence of 128 parallels high and 255 times width is one unit, and is called an FEC frame.

Each FEC frame of 128 parallels high is converted into a code word sequence which will be outputted and transmitted by an FEC multiplexing circuit in series order after RS coded. It can be considered that this conversion is deinterleaving processing having a depth of 128.

A receive side converts a received sequence arranged in series order into which noise has been mixed when passing through an optical communication path into 128 parallel received sequences using an FEC demultiplexing circuit having the same structure as that of the transmit side. The receive side then performs RS code decoding processing on the 128 parallel received sequences in units of 8 parallels high and 239 times width. The receive side further delivers the RS-decoded 128 parallel sequences to a speed conversion unit and an overhead separating circuit so as to convert them into 128 parallel estimated information sequences. The receive side then converts the sequences into estimated information sequences to be outputted in series order using an FEC multiplexing circuit having the same structure as that of the transmit side.

In accordance with the technology disclosed in patent reference 1, the order of inputted information is rearranged using a first interleaving circuit, a first error correcting code is generated using an RS(239,223) coding circuit, the order of the information is rearranged into the original one using a first deinterleaving circuit, and a second error correcting code is generated using an RS(255,239) coding circuit. At the time of decoding the information, the second error correcting code is decoded and errors included in the information are corrected using an RS(255,239) decoding circuit, the order of the information is rearranged using a second interleaving circuit, the first error correcting code is decoded and remaining errors included in the information is corrected using an RS(239,223) decoding circuit, and the order of the information is rearranged into the original one using a second deinterleaving circuit.

[Patent reference 1] JP, 2001-168734, A

A problem with the prior art error correction coding apparatus constructed as mentioned above is that because it is necessary to perform coding processing and transmission processing in units of FEC frames, and each of the processings is restricted by the size of FEC frames, the capability of correcting for burst errors is restricted by the size of FEC frames.

The present invention is made in order to solve the above-mentioned problem, and it is therefore an object of the present invention to provide an improvement in the capability of correcting for burst errors without being restricted by the size of FEC frames, i.e., units on which coding processing is performed.

DISCLOSURE OF THE INVENTION

In accordance with the present invention, there is provided an error correction coding apparatus including: a first coding unit for coding a sequence to be coded which includes information source data for each frame to generate an error correcting code word sequence including a parity sequence; and a first rearranging unit for rearranging elements of the error correcting code word sequences of a plurality of frames generated by the first coding unit. The first rearranging unit rearranges elements of the parity sequences included in the error correcting code word sequences. The first rearranging unit also rearranges elements of the error correcting code word sequences other than the parity sequences, within the error correcting code word sequences other than the parity sequences.

As a result, because the coding processing can be carried out without being restricted by the size of units to be coded, the capability of correcting for burst errors can be improved.

In accordance with the present invention, there is provided an error correction decoding apparatus including: a first rearranging unit for rearranging elements of sequences to be decoded of a plurality of frames, which correspond to error correcting code word sequences of a plurality of frames including parity sequences generated by coding for each frame, and include parity-corresponding sequences corresponding to the parity sequences; and a first decoding unit for decoding the sequences to be decoded of the plurality of frames rearranged by the first rearranging unit for each frame to generate an estimated code word sequence. The first rearranging unit rearranges elements of the parity-corresponding sequences included in the sequence to be decoded with the parity-corresponding sequences on the plurality of frames. The first rearranging unit also rearranges elements of the sequences to be decoded other than the parity-corresponding sequences, within the sequences to be decoded other than the parity-corresponding sequences on the plurality of frames.

As a result, because the coding processing can be carried out without being restricted by the size of units to be coded, the capability of correcting for burst errors can be improved.

BRIEF DESCRIPTION OF THE FIGURES

FIG. 3 is a diagram showing the structure of an FEC frame in accordance with embodiment 1 of the present invention;

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
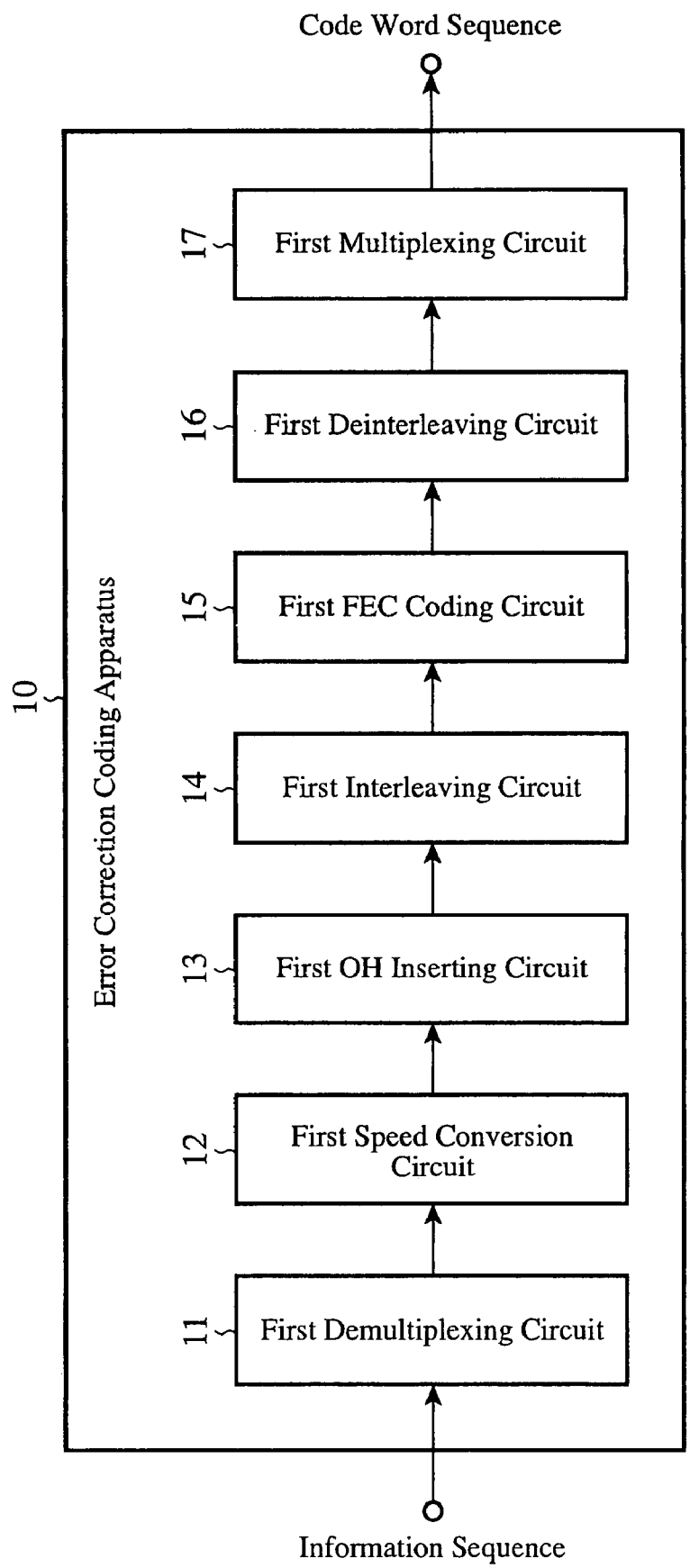
FIG. 1 is a block diagram showing the structure of an error correction coding apparatus in accordance with embodiment 1 of the present invention.

FIG. 1 is a block diagram showing the structure of an error correction coding apparatus 10 in accordance with embodiment 1 of the present invention. As shown in the figure, the error correction coding apparatus 10 is provided with a first demultiplexing circuit (a frame generating unit) 11, a first speed conversion circuit (the frame generating unit) 12, a first overhead (OH) inserting circuit (the frame generating unit) 13, a first interleaving circuit (a first interleaving unit) 14, a first FEC coding circuit a (first coding unit) 15, a first deinterleaving circuit (a first deinterleaving unit) 16, and a first multiplexing circuit (a multiplexing unit) 17.

Figure 2:
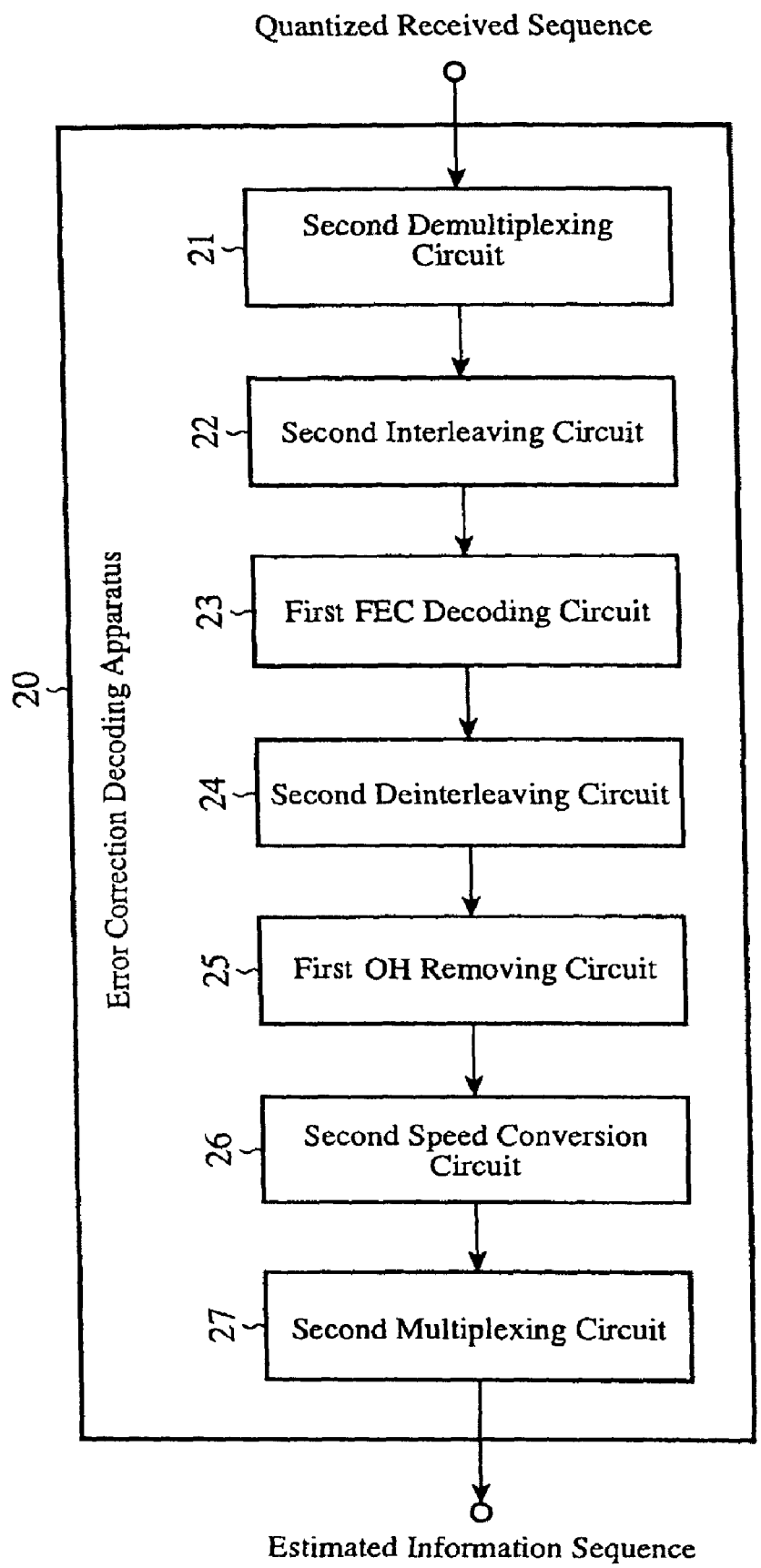
FIG. 2 is a block diagram showing the structure of an error correction decoding apparatus in accordance with embodiment 1 of the present invention.

FIG. 2 is a block diagram showing the structure of an error correction decoding apparatus 20 which corresponds to the error correction coding apparatus 10. As shown in the figure, the error correction decoding apparatus 20 is provided with a second demultiplexing circuit (a demultiplexing unit) 21, a second interleaving circuit (a second interleaving unit) 22, a first FEC decoding circuit (a first decoding unit) 23, a second deinterleaving circuit (a second deinterleaving unit) 24, a first OH removing circuit (an information sequence generating unit) 25, a second speed conversion circuit (the information sequence generating unit) 26, and a second multiplexing circuit (the information sequence generating unit) 27.

Next, the operations of the error correction coding apparatus and error correction decoding apparatus in accordance with this embodiment of the present invention will be explained.

FIG. 3 is a diagram showing an example of the structure of an FEC frame which the error correction coding apparatus 10 and error correction decoding apparatus 20 use.

In accordance with embodiment 1, a single FEC frame buffer 61 is provided for an FEC frame. The single FEC frame buffer 61 is a virtual region consisting of an array with a number of rows m=128 bits and a number of columns n=255 bits, for buffering an FEC frame in order indicated by arrows shown in the figure. The single FEC frame buffer 61 includes a region 62 (the 0-th column) for overheads, an information sequence region 63 (the 1st to 238-th columns), and a parity sequence region 64 (the 239-th to 254-th columns).

In the single FEC frame buffer 61, each of the plurality of columns is divided into 8-bit sections, and each of the 8-bit sections is assigned to one symbol of a Galois field $GF(2^8)$. That is, each of the plurality of columns is divided into 16 symbols.

When an information sequence having binary elements is inputted to the error correction coding apparatus 10 in series order, the first demultiplexing circuit 11 converts the information sequence into m parallel information sequences. To be more specific, the inputted information sequence is buffered in the information sequence region 63 of the single FEC frame buffer 61 shown in FIG. 3 according to the sequence indicated by the arrows of FIG. 3, and is outputted as the m parallel information sequences.

Next, the first speed conversion circuit 12 multiplies the speed of transmission of the m parallel information sequences outputted from the first demultiplexing circuit 11 by $n/(k-1)$ (k is the sum of the number of columns included in the region 62 for overheads, and the number of columns included in the information sequence region 63 in the single FEC frame buffer 61). Furthermore, the first OH inserting circuit 13 adds an overhead to the m parallel information sequences. At that time, dummy data is inserted into the parity sequence region 64. Concretely, 0 is inserted into the whole of the parity sequence region, for example.

The first interleaving circuit 14 then performs interleaving processing (referred to as block interleaving from here on) on a plurality of FEC frames.

Figure 4:
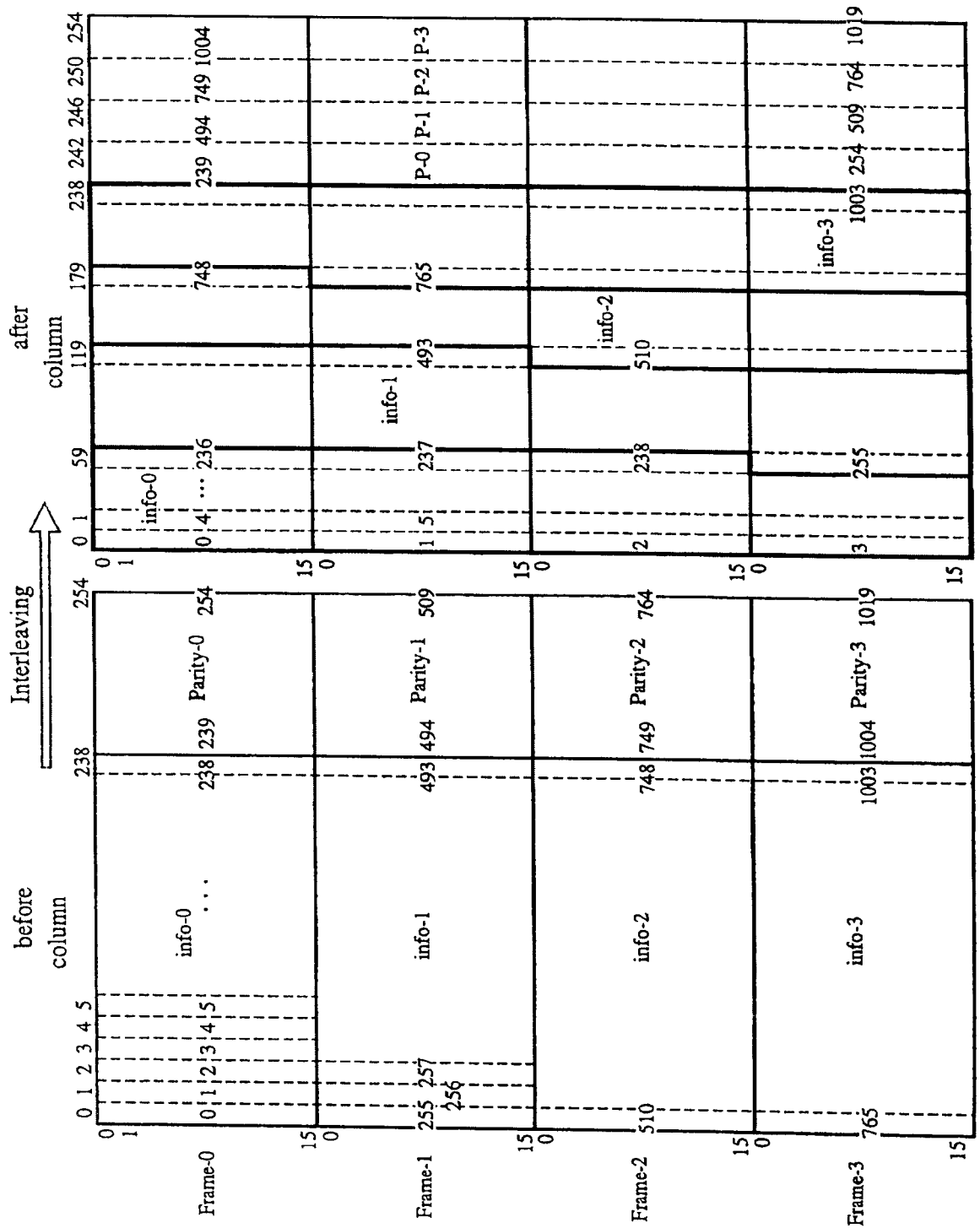
FIG. 4 is a diagram showing an interleaving method in accordance with embodiment 1 of the present invention.

FIG. 4 is a diagram explaining an interleaving method in accordance with embodiment 1. In this case, the number f of frames on which the block interleaving is performed at a time is set to 4. Although there is no rule in particular in the numeric value f, the numeric value f is determined after constraints including restrictions on the communication system are judged synthetically because there is a demerit of increasing the amount of delayed processes and the amount of storage while there is a merit of improving the capability of correcting for burst errors as the numeric value f is increased.

The left side (before) of the figure shows a state in which the block interleaving has not been performed yet, and four single FEC frame buffers 61 are arranged as shown in the figure. In these four single FEC frame buffers 61, the regions 62 for overheads, information sequence regions 63, and parity sequence regions 64 are interleaved, respectively. The right side (after) of the figure shows a state in which the block interleaving has been performed, and, for each column, in units of 16 symbols, sequences which are arranged from the left to the right in the left side of the figure before the block interleaving has been performed are rearranged so that they are arranged in a sequence running from an upper side to a lower side, and are then buffered. For the sake of convenience, this virtual region is referred to as a plurality of interleaved frame buffers. These frame buffers are elements which are used for convenience in explanation of the interleaving method, and do not impose any restrictions on the interleaving method which is actually implemented in the error correction coding apparatus.

The first interleaving circuit 14 can consist of one or more memory areas which correspond to the plurality of FEC frame buffers, an input port to the memory areas and an output port of the memory areas, and an address table. The address table corresponds to a block interleaving converting method, and the interleaving processing is implemented by controlling an input address and an output address of the memory areas.

The interleaving method in accordance with embodiment 1 will be explained with reference to equations.

i(0 to 1019) is a number uniquely assigned to each column of the four single FEC frame buffers 61, and shows an address of each column on which the block interleaving has been performed. addr_bf(i) (0 to 1019) is an address of a yet-to-be-block-interleaved column which corresponds to i, frame_af(i) (0 to 3) is a frame number to which the column i belongs, frame_bf(i) (0 to 3) is a frame number of the yet-to-be-block-interleaved column which corresponds to i, col_af (i) (0 to 255) is a column number of i in a single FEC frame buffer 61 to which i belongs, and col_bf(i) (0 to 255) is a column number of the yet-to-be-block-interleaved column which corresponds to i in a single FEC frame buffer 61. First, frame_af(i) and col_af(i) are determined according to equations (1) and (2).

$$\text{frame\_}af(i)=[i/255] \quad (1)$$

$$\text{col\_}af(i)=i \bmod 255 \quad (2)$$

where [x] shows a maximum of integers which do not exceed x, and "a mod b" shows a remainder which is obtained by dividing a by b.

Next, the interleaving processing is performed differently according to the value of col_af(i).

1. In the case of col_af(i)<239
frame_bf(i) and col_bf(i) are determined according to the following equations (3) and (4).

$$\text{frame\_}bf(i)=[(\text{col\_}af(i)\times 4+\text{frame\_}af(i))/239] \quad (3)$$

$$\text{col\_}bf(i)=(\text{col\_}af(i)\times 4+\text{frame\_}af(i))\bmod 239 \quad (4)$$

In addition, addr_bf(i) is determined according to the following equation (5).

$$\text{addr\_}bf(i)=\text{frame\_}bf(i)\times 255+\text{col\_}bf(i) \quad (5)$$

2. In the case of col_af(i)>=239

$$\text{frame\_}bf(i)=[(\text{col\_}af(i)-239)/4] \quad (6)$$

$$\text{col\_}bf(i)=\{(\text{col\_}af(i)-239)\bmod 4\}\times 4+\text{frame\_}af(i)+ 239 \quad (7)$$

In addition, addr_bf(i) is determined according to the equation (5).

The first interleaving circuit 14 does not perform the interleaving processing on the parity sequence region 64 when either of the following conditions is satisfied.

Condition 1: in the case in which the result of coding is overwritten into the parity sequence region 64 by the first FEC coding circuit 15 which will be mentioned below.

Condition 2: in the case in which the dummy data inserted into the parity sequence region by the first speed conversion circuit 12 has the same value for each interleaving processing (in units of 128 bits high and 1 bit wide).

In order to achieve synchronization of the start point of the interleaving by the first interleaving circuit 14, a unique pattern for synchronization is added to the leading overhead region of the plurality of yet-to-be-interleaved frame buffers. The addition of this unique pattern is carried out by the first OH inserting circuit 13.

Next, the first FEC coding circuit 15 carries out coding processing.

In accordance with embodiment 1, assume that an RS code having a code length n=255 symbols, an information length k=239 symbols, and a number of bits per one symbol p=8, which is a kind of block code, is used as an error correcting code. This code is referred to as the RS(255,239) from here on. As an alternative, a parameter applicable to FEC frames can be used as the error correcting code.

The first FEC coding circuit 15 divides the plurality of interleaved frame buffers into a plurality of single FEC frame buffers 61 first by, for example, dividing them at a boundary between the 127th row and the 128th row and a boundary between the 255th row and the 256th row. These single FEC frame buffers 61 have the same shape as a single FEC frame buffer 61 on which no interleaving processing has been performed, and have a sequence of bits arranged therein which is different from that of the yet-to-be-interleaved single FEC frame buffer 61. Next, RS(255,239) coding processing is performed on each of the single FEC frame buffers 61. A parity sequence generated through the RS (255,239) coding processing is buffered into a corresponding parity sequence region 64.

After the first FEC coding circuit 15 performs the RS coding processing on each of the single FEC frame buffers, the first deinterleaving circuit 16 performs deinterleaving processing on the plurality of interleaved frame buffers. Concretely, the deinterleaving processing is carried out in a sequence reverse to that of the interleaving processing by the first interleaving circuit 14, the sequence of the plurality of interleaved frame buffers shown in FIG. 4 is rearranged into sequences in the plurality of yet-to-be-interleaved frame buffers, and they are buffered.

The first deinterleaving circuit 16 can be comprised of one or more memory areas which correspond to the plurality of FEC frame buffers, an input port to the memory areas, an output port from the memory areas, and an address table, for example. An input address and an output address of the memory areas are controlled using the address table, and the RS code word sequences are written in the memory areas with the input address and output address according to a procedure reverse to that of the first interleaving circuit 14.

The plurality of yet-to-be-interleaved frame buffers which have not been processed by the first interleaving circuit 14 and the plurality of yet-to-be-interleaved frame buffers which have been processed by the first deinterleaving circuit 16 can share the same memory area when actually implemented. In this case, it is not necessary to update memory areas for data stored in the region 62 for overheads, and for data stored in the information sequence region 63.

Next, the first multiplexing circuit 17 converts the m parallel code word sequences into a series sequence. The first multiplexing circuit carries out the conversion by buffering the m parallel code word sequences in the single FEC frame buffer 61 as shown in FIG. 3 so that they are sequentially running from the left to the right, and then outputting them, as a series sequence, in order in which they are located from an upper side to a lower side and then from the left to the right when the amount of buffered data reaches the equivalent of 1FEC frame.

Next, the operation of the error correction decoding apparatus 20 will be explained.

When a quantized received sequence having binary elements is inputted to the error correction decoding apparatus 20 in series order, the second demultiplexing circuit 21 converts it into m parallel sequences. Concretely, the second demultiplexing circuit buffers the inputted received sequence in a single FEC frame buffer 61 as shown in FIG. 3 so that the sequence is running in a direction of the arrows shown in the figure, and outputs it as m parallel sequences.

Next, the second interleaving circuit 22 carries out block interleaving. In this case, the second interleaving circuit carries out the block interleaving, like the first interleaving circuit 14.

The second interleaving circuit 22 can consist of one or more memory areas which correspond to the plurality of FEC frame buffers, an input port to the memory areas and an output port of the memory areas, and an address table, for example. The address table corresponds to a block interleaving converting method, and the interleaving processing is implemented by controlling an input address and an output address of the memory areas.

The first FEC decoding circuit 23 carries out RS(255,239) decoding processing. The first FEC decoding circuit divides the plurality of interleaved frame buffers into a plurality of single FEC frame buffers 61 first by, for example, dividing them at a boundary between the 127th row and the 128th row and a boundary between the 255th row and the 256th row. These single FEC frame buffers 61 have the same shape as a single FEC frame buffer 61 on which no interleaving processing has been performed, and have a sequence of bits arranged therein which is different from that of the yet-to-be-interleaved single FEC frame buffer 61. Next, the RS(255,239) decoding processing is performed on each of the single FEC frame buffers 61. An estimated code word sequence which is thus generated is overwritten in a corresponding single FEC frame buffer 61.

After the first FEC decoding circuit 23 performs the RS decoding processing on each of the single FEC frame buffers, the second deinterleaving circuit 24 performs deinterleaving processing on the plurality of interleaved frame buffers. Concretely, the deinterleaving processing is carried out in a sequence reverse to that of the interleaving processing by the second interleaving circuit 22, the sequence of the plurality of interleaved frame buffers is rearranged into sequences in the plurality of yet-to-be-interleaved frame buffers, and they are buffered.

The second deinterleaving circuit 24 can be comprised of one or more memory areas which correspond to the plurality of FEC frame buffers, an input port to the memory areas, an output port from the memory areas, and an address table, for example. An input address and an output address of the memory areas are controlled using the address table, and the estimated RS code word sequences are written in the memory areas with the input address and output address being the output address and input address in the interleaving processing by the second interleaving circuit 22, respectively.

In a case in which the plurality of yet-to-be-interleaved frame buffers which have not been processed by the second interleaving circuit 22 and the plurality of yet-to-be-interleaved frame buffers which have been processed by the second deinterleaving circuit 24 share the same memory area when actually implemented, the bits of binary elements which are reversed through the RS decoding processing only have to be rewritten.

The first OH removing circuit 25 then removes the overhead added by the first OH insertion circuit 13. Next, the second speed conversion circuit 26 multiplies the speed of transmission of the m parallel sequences by $(k-1)/n$.

The second multiplexing circuit 27 converts the m parallel estimated code word sequences into a series sequence. The second multiplexing circuit carries out the conversion by buffering the m parallel estimated code word sequences in the single FEC frame buffer 61 as shown in FIG. 3 so that they are sequentially running from the left to the right, and then outputting them, as a series sequence, in order in which they are located from an upper side to a lower side and then from the left to the right when the amount of buffered data reaches the equivalent of 1FEC frame.

Figure 5:
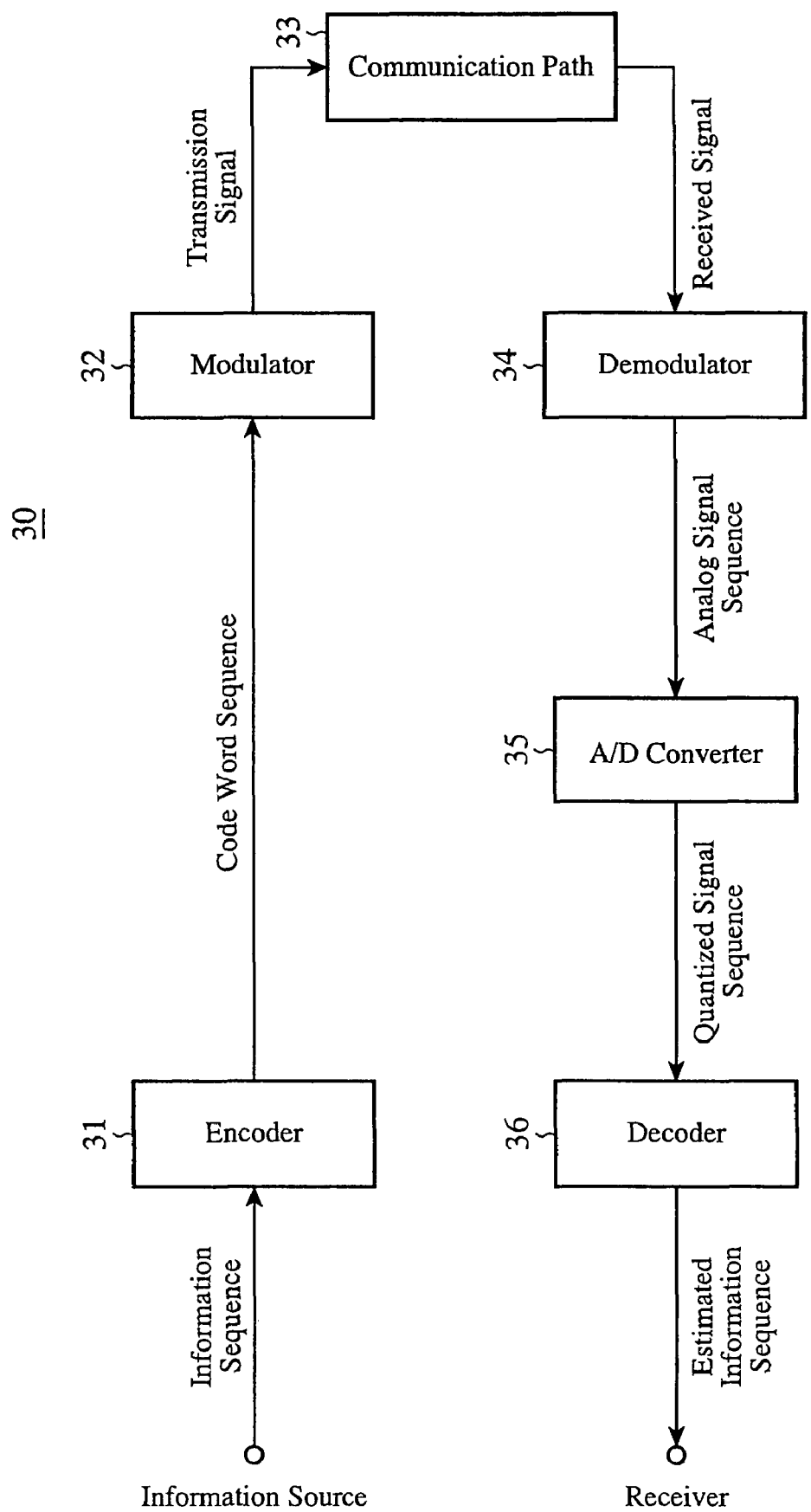
FIG. 5 is a block diagram showing the structure of a transmission system in accordance with embodiment 1 of the present invention.

An example of the structure of the transmission system 30 which uses the error correction coding apparatus 10 and error correction decoding apparatus 20 in accordance with embodiment 1 is shown in FIG. 5. The transmission systems 30 is provided with an encoder 31, a modulator 32, a communication path 33, a demodulator 34, an A/D converter 35, and a decoder 36. The encoder 31 is the same as the error correction coding apparatus 10 in accordance with embodiment 1, and the decoder 36 is the same as the error correction decoding apparatus 20 in accordance with embodiment 1. The modulator 32, communication path 33, demodulator 34, and A/D converter 35 are units which are commonly used.

As mentioned above, in accordance with embodiment 1, the error correction coding apparatus 10 and error correction decoding apparatus 20 perform block interleaving processing on a plurality of FEC frames using the first interleaving circuit 14 and second interleaving circuit 22, respectively. Therefore, the capability of correcting for burst errors can be improved without being restricted by the size of FEC frames even if the coding processing and transmission processing are restricted by the size of FEC frames.

Embodiment 2

Figure 6:
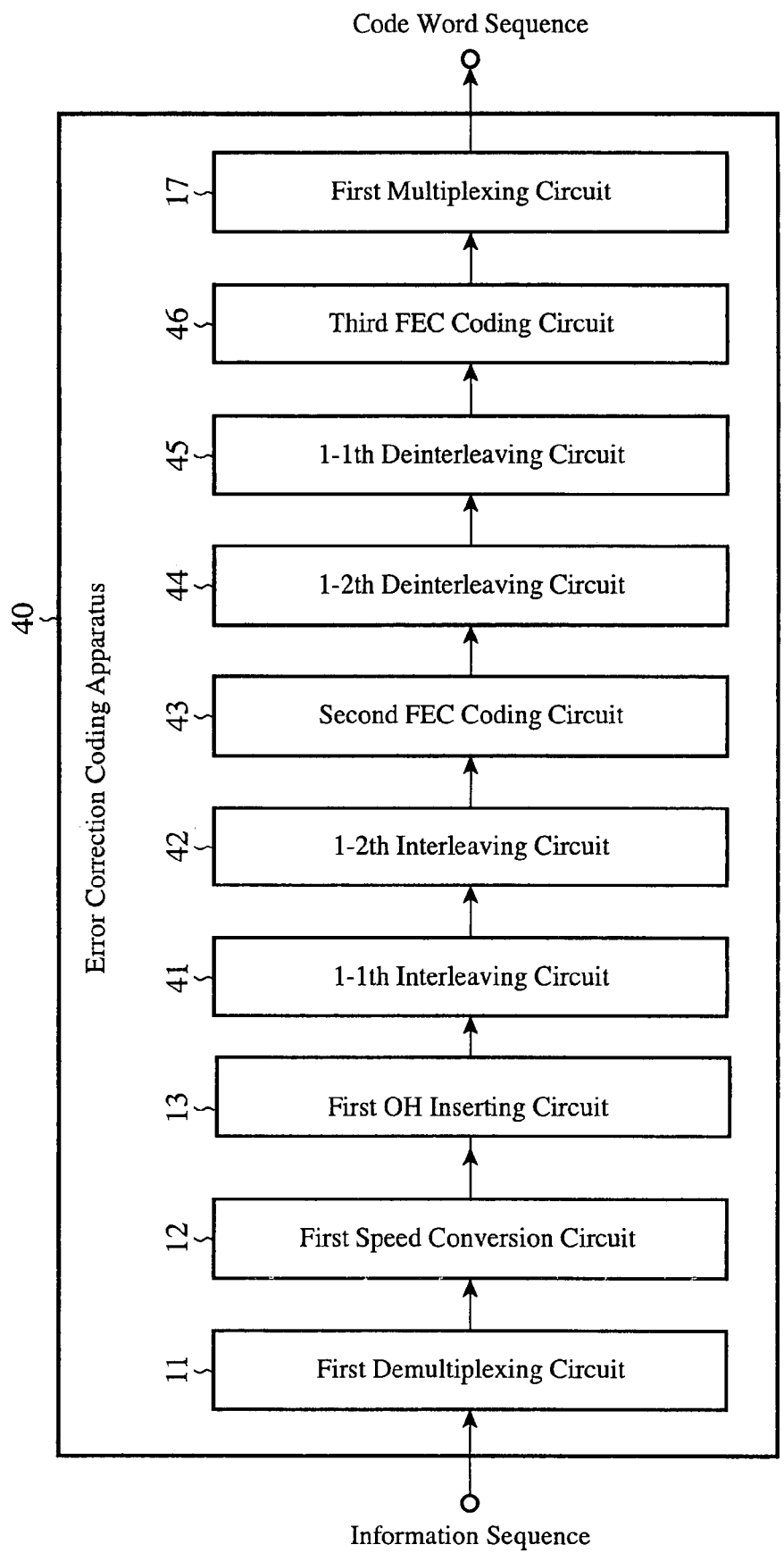
FIG. 6 is a block diagram showing the structure of an error correction coding apparatus in accordance with embodiment 2 of the present invention.

FIG. 6 is a block diagram showing the structure of an error correction coding apparatus 40 in accordance with embodiment 2 of the present invention. The same reference numerals as shown in FIG. 1 denote the same components, respectively. As shown in the figure, the error correction coding apparatus 40 is provided with a 1-1th interleaving circuit (a first interleaving unit) 41, a 1-2th interleaving circuit (a third interleaving unit) 42, a second FEC coding circuit (a first coding unit) 43, a 1-2th deinterleaving circuit (a third deinterleaving unit) 44, a 1-1th deinterleaving circuit (a first deinterleaving unit) 45, and a third FEC coding circuit (a second coding unit) 46.

Figure 7:
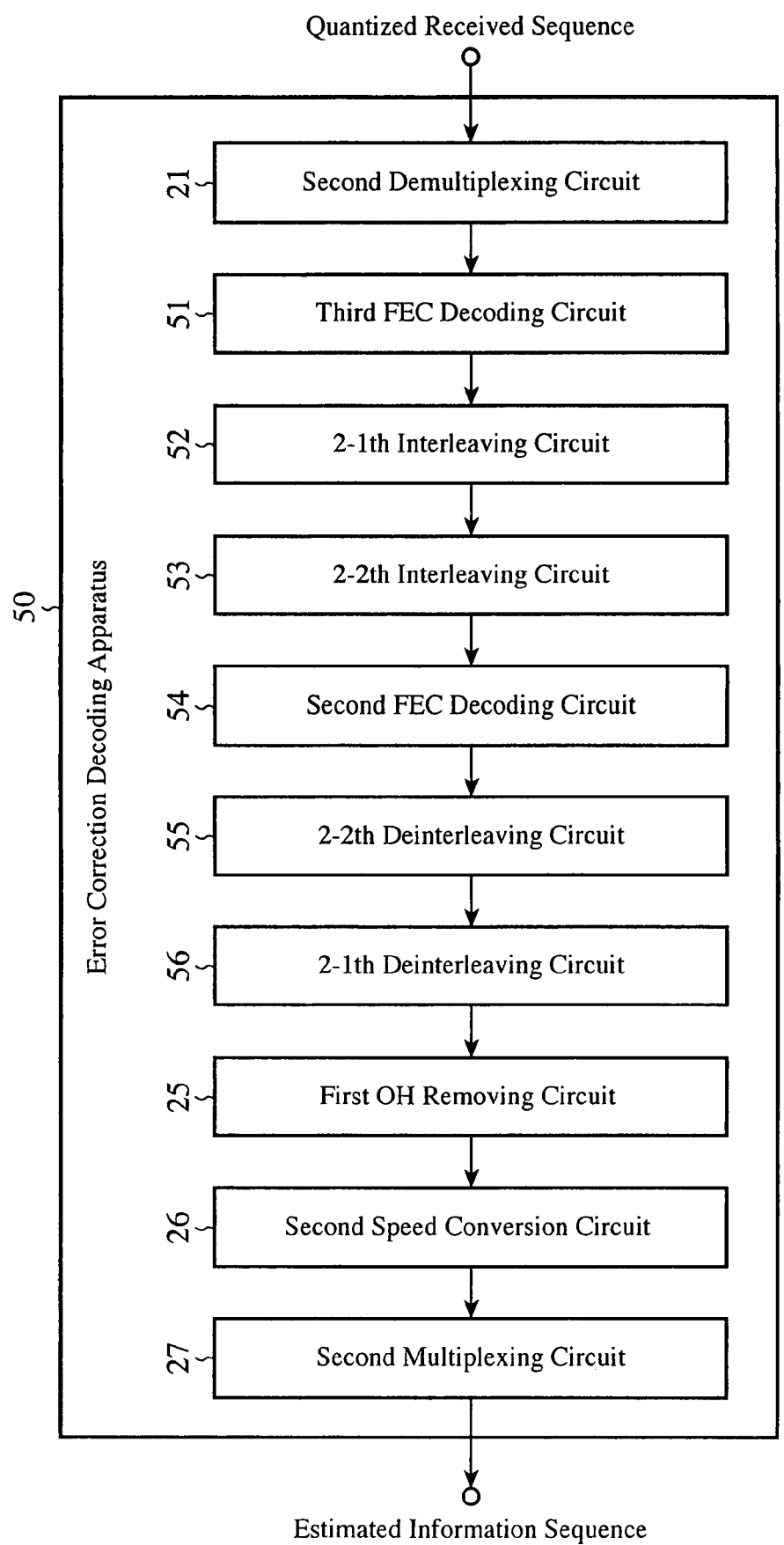
FIG. 7 is a block diagram showing the structure of an error correction decoding apparatus in accordance with embodiment 2 of the present invention.

FIG. 7 is a block diagram showing the structure of an error correction decoding apparatus 50 in accordance with embodiment 2 of the present invention. The same reference numerals as shown in FIG. 2 denote the same components, respectively. As shown in the figure, the error correction decoding apparatus 50 is provided with a third FEC decoder circuit (a second decoding unit) 51, a 2-1th interleaving circuit (a second interleaving unit) 52, a 2-2th interleaving circuit (a fourth interleaving unit) 53, a second FEC decoder circuit (a first decoding unit) 54, a 2-2th deinterleaving circuit (a fourth deinterleaving unit) 55, and a 2-1th deinterleaving circuit (a second deinterleaving unit) 56.

Next, the operations of the error correction coding apparatus and error correction decoding apparatus in accordance with this embodiment of the present invention will be explained.

Figure 8:
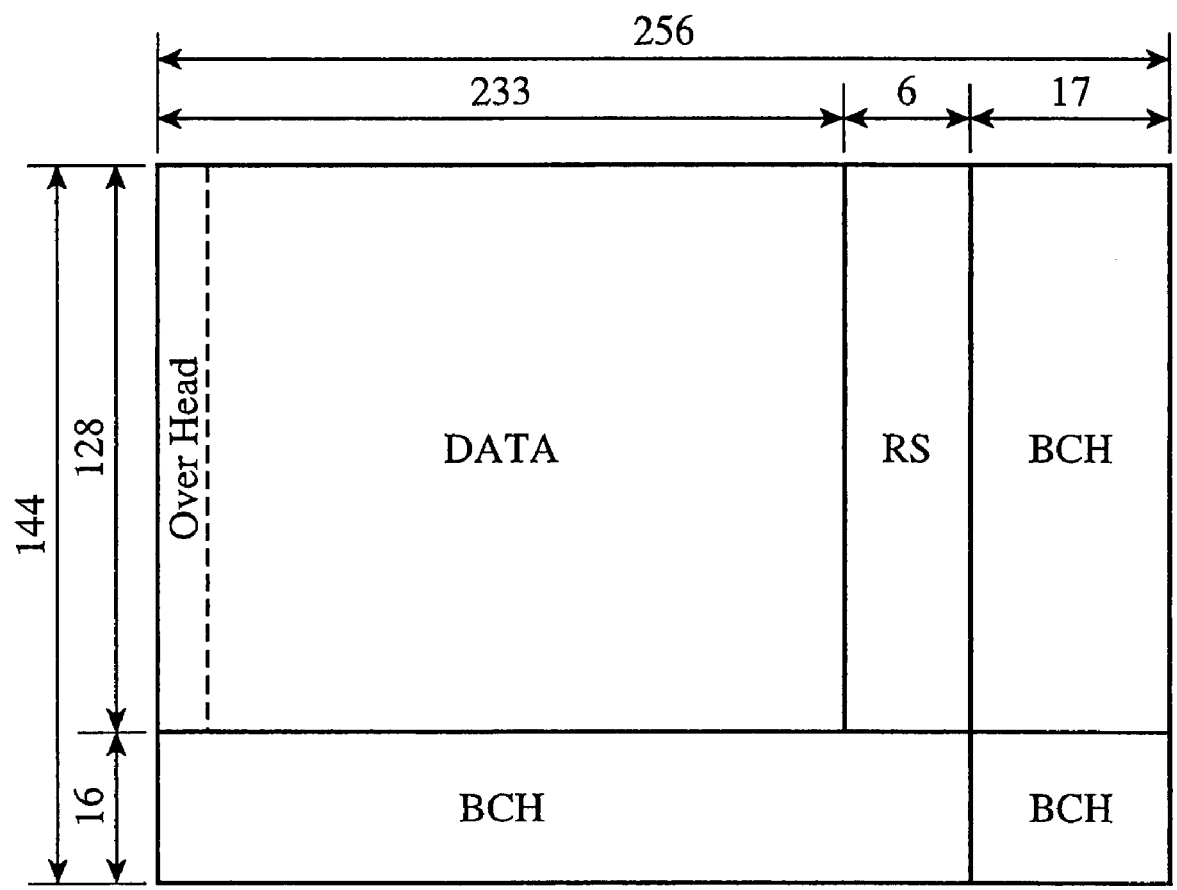
FIG. 8 is a diagram showing the structure of an FEC frame in accordance with embodiment 2 of the present invention.

FIG. 8 is a diagram showing an example of the structure of an FEC frame which the error correction coding apparatus 40 and error correction decoding apparatus 50 use. In accordance with embodiment 2, assume that an RS code having a code length $n_0=239$ symbols, an information length $k_0=233$ symbols, and a number of bits per one symbol $p_0=8$, which is a kind of block code, is used as an error correcting code, the RS code being also used as an outer code. This code is referred to as the RS(239,233) from here on. Furthermore, assume that a product code obtained by performing two dimensional coding on a BCH code (BCH(144,128)) having a code length $n_1=144$ bits and an information length $k_1=128$ bits and a BCH code (BCH(256,239)) having a code length $n_2=256$ bits and an information length $k_2=239$ bits is used as an inner code.

In this example of the structure of an FEC frame, an information sequence which is rearranged so that it has rows whose number is $m'(=k_1)$ bits and columns whose number is $n'(=k_0-1)$ bits is coded into a code word sequence having rows whose number is $m(=n_1)$ bits and columns whose number is $n(=n_2)$ bits.

Furthermore, the outer code is concatenated with the inner code for the error correcting code, and the concatenation can be used if it is a parameter applicable to FEC frames.

In this embodiment 2, the first speed conversion circuit 12 multiplies the speed of transmission of the m' parallel information sequences outputted from the first demultiplexing circuit 11 by a clock rate n/n', and outputs them in the form of m parallel sequences. In this case, the output speed of the whole data becomes equal to (n×m)/(m'×n').

Figure 9:
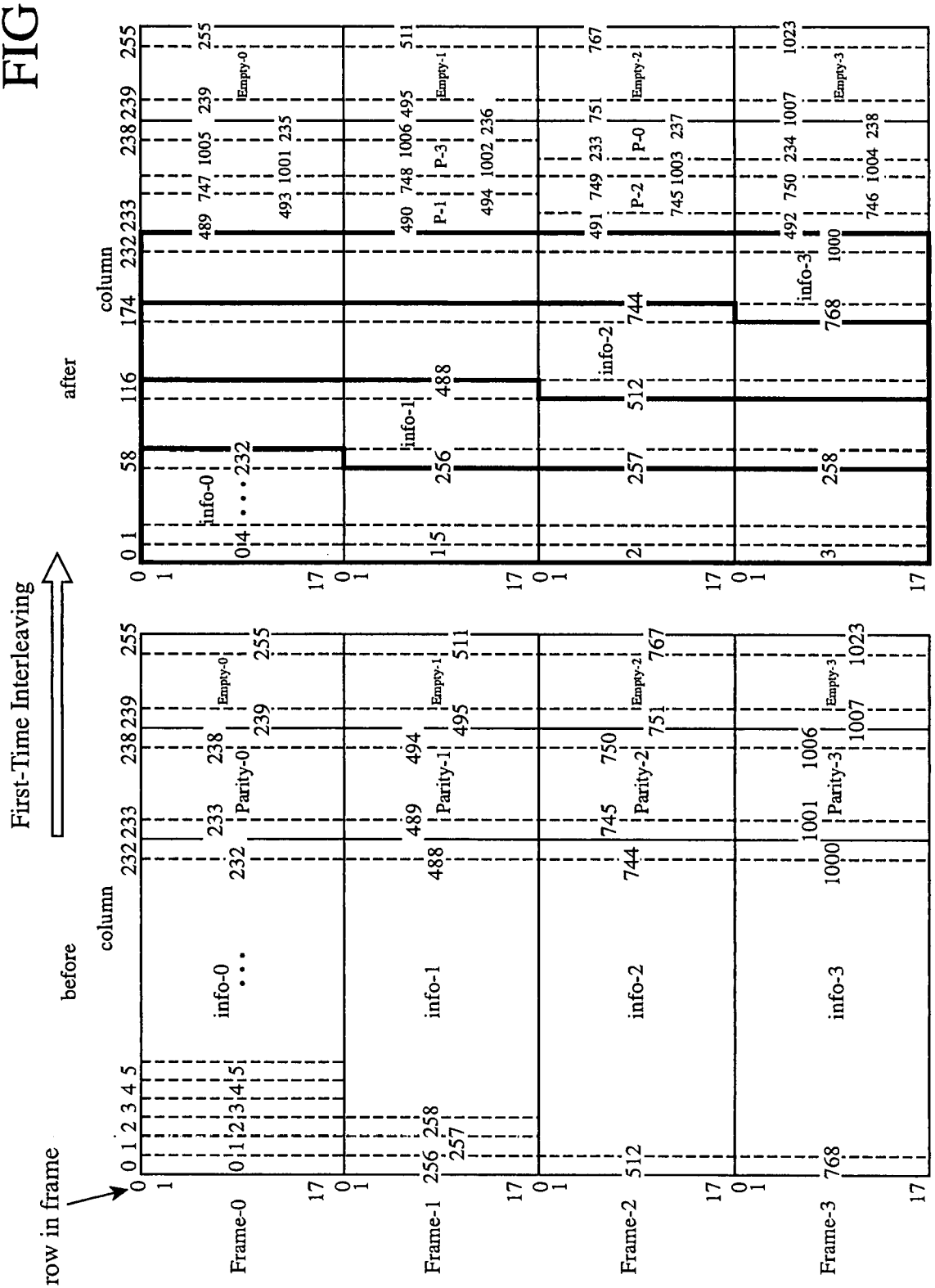
FIG. 9 is a diagram showing a first-time interleaving method in accordance with embodiment 2 of the present invention.

In this embodiment 2, each of interleaving processing and deinterleaving processing is carried out in the two steps. FIG. 9 is a diagram showing a first-time interleaving method which the 1-1th interleaving circuit 41 adopts. In this case, the number f of frames on which the block interleaving is performed at a time is set to 4. The 1-1th interleaving circuit 41 carries out the block interleaving process of converting a state in which a plurality of frame buffers have not been interleaved as shown in the left side of FIG. 9 into a state in which the plurality of frame buffers have been interleaved as shown in the right side of FIG. 9.

The 1-1th interleaving circuit 41 can consist of one or more memory areas which correspond to the plurality of FEC frame buffers, an input port to the memory areas and an output port of the memory areas, and an address table, for example. The address table corresponds to a block interleaving converting method, and the interleaving processing is implemented by controlling an input address and an output address of the memory areas.

The interleaving method in accordance with embodiment 1 will be explained with reference to equations.

i(0 to 1023) is a number uniquely assigned to each column of the four single FEC frame buffers 61, and shows an address of each column on which the block interleaving has been performed. addr_bf(i) (0 to 1023) is an address of a yet-to-be-block-interleaved column which corresponds to i, frame_af(i) (0 to 3) is a frame number to which the column i belongs, frame_bf(i) (0 to 3) is a frame number of the yet-to-be-block-interleaved column which corresponds to i, col_af (i) (0 to 255) is a column number of i in a single FEC frame buffer 61 to which i belongs, and col_bf(i) (0 to 255) is a column number of the yet-to-be-block-interleaved column which corresponds to i in a single FEC frame buffer 61.

First, frame_af(i) and col_af(i) are determined according to the following equations (8) and (9).

$$\text{frame\_}af(i)=[i/256] \quad (8)$$

$$\text{col\_}af(i)=i \bmod 256 \quad (9)$$

where [x] shows a maximum of integers which do not exceed x, and "a mod b" shows a remainder which is obtained by dividing a by b.

Next, the interleaving processing is performed differently according to the value of col_af(i).

1. In the case of col_af(i)<233 frame_bf(i) and col_bf(i) are determined according to the following equations (10) and (11).

$$\text{frame\_}bf(i)=[(\text{col\_}af(i)\times4+\text{frame\_}af(i))/233] \quad (10)$$

$$\text{col\_}bf(i)=(\text{col\_}af(i)\times4+\text{frame\_}af(i))\bmod 233 \quad (11)$$

In addition, addr_bf(i) is determined according to the following equation (12).

$$\text{addr\_}bf(i)=\text{frame\_}bf(i)\times256+\text{col\_}bf(i) \quad (12)$$

2. In the case of 233<=col_af(i)<239 addr_bf(i) is determined with reference to FIG. 9.

3. In the case of 239<=col_af(i)

addr_bf(i) is determined according to the following equation (13).

$$\text{addr\_}bf(i)=i \quad (13)$$

Next, the 1-2th interleaving circuit 42 carries out second-time interleaving processing. Before sending the information sequence which has been interleaved by the 1-1th interleaving circuit 41 to the second FEC coding circuit 43, the 1-2th interleaving circuit 42 further changes the order of the information sequence in units of RS symbols. The 1-2th interleaving circuit 42 carries out this changing process for each of the plurality of single FEC frame buffers 61. Furthermore, the 1-2th interleaving circuit carries out this changing process for only a region (having rows whose number is 16 symbols and columns whose number is 239 symbols) in which the outer code RS(239,233) is included. The second FEC coding circuit 43 performs coding processing on the information sequence outputted from the 1-2th interleaving circuit 42 with the outer code RS(239,233) so that m'/P0 coding processes are done in parallel.

Figure 10:
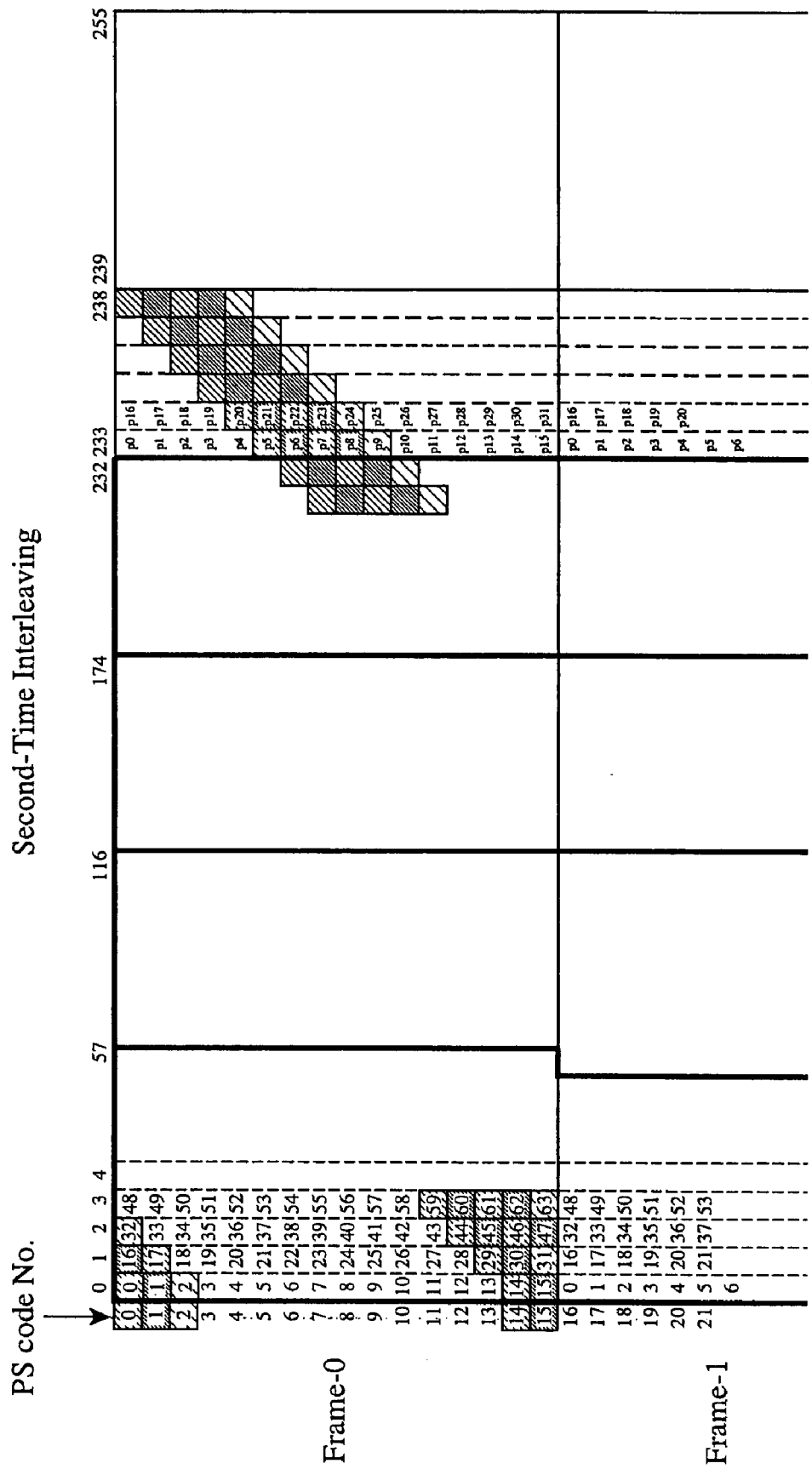
FIG. 10 is a diagram showing a second-time interleaving method in accordance with embodiment 2 of the present invention.

FIG. 10 is a diagram showing an example of the second-time interleaving method. In a case in which RS symbols are inputted to the 1-2th interleaving circuit 42 in order of numbers 0, 1, 2, . . . respectively assigned to the RS symbols, the second FEC coding circuit 43 codes them in order that they are running in such a diagonal direction, i.e., in order of RS code No. 0:0, 31, 46, 61, . . . , 3721, p7, p22, . . . , p82, RS code No. 1:1, 16, 47, 62, . . . , 3722, p8, p23, . . . , and p83, as shown in this figure. When the RS symbols are outputted from the 1-2th deinterleaving circuit 44, the position of each of the RS symbols is unchanged, and they are outputted in order of 0, 1, 2, . . . , 3728, p0, p1, . . . , and p95.

The 1-2th interleaving circuit 42 can consist of one or more memory areas which correspond to the plurality of FEC frame buffers, an input port to the memory areas and an output port of the memory areas, and an address table, for example. The address table corresponds to an interleaving converting method, and the interleaving processing is implemented by controlling an input address and an output address of the memory areas.

The 1-2th deinterleaving circuit 44 performs deinterleaving processing on the code word sequence which has been RS-coded by the second FEC coding circuit 43. Concretely, the 1-2th deinterleaving circuit rearranges the order of the RS code word sequence within the plurality of interleaved frame buffers according to a procedure reverse to that of the interleaving processing done by the 1-2th interleaving circuit 42, and then buffers the RS code word sequence.

The 1-2th deinterleaving circuit 44 can be comprised of one or more memory areas which correspond to the plurality of FEC frame buffers, an input port to the memory areas, an output port from the memory areas, and an address table, for example. An input address and an output address of the memory areas are controlled using the address table, and the RS code word sequence is written in the memory areas with the input address and output address being the output address and input address in the interleaving processing by the 1-2th interleaving circuit 42, respectively.

The plurality of yet-to-be-interleaved frame buffers which have not been processed by the 1-2th interleaving circuit 42 and the plurality of yet-to-be-interleaved frame buffers which have been processed by the 1-2th deinterleaving circuit 44 can share the same memory area when actually implemented. In this case, it is not necessary to perform the interleaving processing on data stored in the region 62 for overheads, and data stored in the information sequence region 63.

The memory areas of each of the 1-2th interleaving circuit 42 and 1-2th deinterleaving circuit 44 can be logically constructed of a RAM (Random Access Memory), or can be alternatively constructed of an FIFO (First-In First-Out). In a case in which the memory areas of each of the 1-2th interleaving circuit and 1-2th deinterleaving circuit are constructed of an FIFO, the input and output addresses (or line numbers of RS symbols) of the second FEC coding circuit 43 only have to be shifted for every clock. The memory areas do not necessarily need to have a memory size corresponding to the plurality of FEC frame buffers when actually implemented. The implementation can be carried out with setting of a memory size corresponding to a single FEC frame buffer, and with memory access control.

Next, the 1-1th deinterleaving circuit 45 performs the deinterleaving processing on the RS code word sequence included in the plurality of interleaved frame buffers rearranged by the 1-2th deinterleaving circuit 44. Concretely, the 1-1th deinterleaving circuit rearranges the order of the RS code word sequence within the plurality of interleaved frame buffers according to a procedure reverse to that of the interleaving processing done by the 1-1th interleaving circuit 41, and then buffers the RS code word sequence.

The 1-1th deinterleaving circuit 45 can be comprised of one or more memory areas which correspond to the plurality of FEC frame buffers, an input port to the memory areas, an output port from the memory areas, and an address table, for example. An input address and an output address of the memory areas are controlled using the address table, and the RS code word sequence is written in the memory areas with the input address and output address being the output address and input address in the interleaving processing by the 1-1th interleaving circuit 41, respectively.

The plurality of yet-to-be-interleaved frame buffers which have not been processed by the 1-1th interleaving circuit 41 and the plurality of yet-to-be-interleaved frame buffers which have been processed by the 1-1th deinterleaving circuit 45 can share the same memory area when actually implemented. In this case, it is not necessary to perform the interleaving processing on data stored in the region 62 for overheads, and data stored in the information sequence region 63.

The third FEC coding circuit 46 codes the sequence included in the plurality of yet-to-be-interleaved frame buffers processed by the 1-1th deinterleaving circuit 45 with the product code of the inner code for each single FEC frame buffer 61.

Next, the operation of the error correction decoding apparatus 50 will be explained.

When a quantized received sequence which has been obtained so that each transmission symbol is quantized into q bits per 1 bit is inputted to the error correction decoding apparatus 50 in the form of q parallel sequences, the second demultiplexing circuit 21 converts the quantized received sequence into m×q parallel sequences. Concretely, the second demultiplexing circuit carries out the conversion by buffering the inputted quantized received sequence in a single FEC frame buffer (having 144-bit rows and 256-bit columns) as shown in FIG. 8 so that they are sequentially running from an upper side to a lower side and then from the left to the right while assigning q bits to each 1 bit of each transmission symbol of the inputted quantized received sequence, and then outputting it as m×q parallel sequences.

The third FEC decoder circuit 51 performs the decoding processing on the product code of the inner code for the received sequence for each single FEC frame. One of various decoding methods for product codes, such as bounded distance decoding, generalized minimum distance decoding, and soft-decision iterative decoding, can be applied to the decoding processing.

The sequence in which the product code is decoded for each single FEC frame is interleaved by the 2-1th interleaving circuit 52. At that time, the 2-1th interleaving circuit carries out the interleaving processing, like the 1-1th interleaving circuit 41.

The 2-2th interleaving circuit 53 further changes the order of the sequence which is interleaved by the 2-1th interleaving circuit 52 in units of RS symbols before the sequence is inputted to the second FEC decoder circuit 54. The 2-2th interleaving circuit carries out this changing process for each single FEC frame buffer 61. At that time, the 2-2th interleaving circuit carries out the interleaving, like the 1-2th interleaving circuit 42.

The second FEC decoding circuit 54 performs decoding processing on the sequence to be decoded outputted from the 2-2th interleaving circuit 53 with the outer code RS(239,233) so that m'/p0 decoding processes are done in parallel.

The 2-2th deinterleaving circuit 55 deinterleaves the code word sequence which is RS-decoded by the second FEC decoder circuit 54. Concretely, the 2-2th deinterleaving circuit rearranges the order of the RS code word sequence within the plurality of interleaved frame buffers according to a procedure reverse to that of the interleaving processing done by the 2-2th interleaving circuit 53, and then buffers the RS code word sequence.

The 2-2th deinterleaving circuit 55 can be comprised of one or more memory areas which correspond to the plurality of FEC frame buffers, an input port to the memory areas, an output port from the memory areas, and an address table, for example. An input address and an output address of the memory areas are controlled using the address table, and the RS code word sequence is written in the memory areas with the input address and output address being the output address and input address in the interleaving processing by the 2-2th interleaving circuit 53, respectively.

In a case in which the plurality of interleaved frame buffers which have not been processed by the 2-2th interleaving circuit 53 and the plurality of interleaved frame buffers which have been processed by the 2-2th deinterleaving circuit 55 share the same memory area when actually implemented, the bits of binary elements which are reversed through the RS decoding processing only have to be rewritten.

The memory areas of each of the 2-2th interleaving circuit 53 and 2-2th deinterleaving circuit 55 can be logically constructed of a RAM, or can be alternatively constructed of an FIFO. In a case in which the memory areas of each of the 2-2th interleaving circuit and 2-2th deinterleaving circuit are constructed of an FIFO, the input and output addresses (or line numbers of RS symbols) of the second FEC decoding circuit 54 only have to be shifted for every clock. The memory areas do not necessarily need to have a memory size corresponding to the plurality of FEC frame buffers when actually implemented. The implementation can be carried out with setting of a memory size corresponding to a single FEC frame buffer, and with memory access control.

The 2-1th deinterleaving circuit 56 deinterleaves the estimated code word sequence which is included in the plurality of interleaved frame buffers rearranged by the 2-2th deinterleaving circuit 55. Concretely, the 2-1th deinterleaving circuit rearranges the sequence of the plurality of interleaved frame buffers into that of the plurality of yet-to-be-interleaved frame buffers according to a procedure reverse to that of the interleaving processing done by the 2-1th interleaving circuit 52, and then buffers the code word sequence.

The 2-1th deinterleaving circuit 56 can be comprised of one or more memory areas which correspond to the plurality of FEC frame buffers, an input port to the memory areas, an output port from the memory areas, and an address table, for example. An input address and an output address of the memory areas are controlled using the address table, and the RS code word sequence is written in the memory areas with the input address and output address being the output address and input address in the interleaving processing by the 2-1th interleaving circuit 52, respectively.

As mentioned above, in the error correction coding apparatus 40 and error correction decoding apparatus 50 in accordance with embodiment 2, the 1-1th interleaving circuit 41, 1-2th interleaving circuit 42, 2-1th interleaving circuit 52, and 2-2th interleaving circuit 53 are so constructed as to perform block interleaving on data before and behind each outer code throughout a plurality of FEC frames. Therefore, the capability of correcting for burst errors can be improved without being restricted by the size of FEC frames even if the coding processing and transmission processing are restricted by the size of FEC frames. In addition, because the interleaving is carried out in two steps before and behind each outer code, lattice errors which remain at the time of decoding inner codes can be dispersed, and the decoding can be carried out at the time of decoding outer codes.

INDUSTRIAL APPLICABILITY

As mentioned above, the error correction coding apparatus and error correction decoding apparatus in accordance with the present invention are suitable for improving the capability of correcting for burst errors without being restricted by the size of FEC frames.

The invention claimed is:

1. An error correction coding apparatus comprising:
a first coding unit for coding a sequence to be coded which includes information source data for each frame to generate an error correcting code word sequence including a parity sequence; and
a first rearranging unit for rearranging elements of the error code word sequences of a plurality of the frames generated by the first coding unit, wherein
the first rearranging unit rearranges elements of the parity sequences included in the error correcting code word sequences, within the parity sequences on the plurality of the frames, and
the first rearranging unit rearranges elements of the error correcting code word sequences other than the parity sequences, within the error correcting code word sequences other than the parity sequences on the plurality of frames.

2. The error correction coding apparatus according to claim 1, further comprising a second coding unit for concatenating the error correcting code word sequence generated by the first coding unit and an error correcting code word sequence generated by coding the error correcting code word sequences rearranged by the first rearranging unit for each frame.

3. The error correction coding apparatus according to claim 1, further comprising:
a frame generating unit for generating a frame data sequence which includes the information source data and corresponds to the error correcting code word sequence for each frame;
a second rearranging for rearranging elements of the frame data sequences of the plurality of the frames generated by the frame generating unit in a procedure which is reverse to that which the first rearranging unit uses;
a third rearranging unit for rearranging the elements of the frame data sequences of the plurality of the frames rearranged by the second rearranging unit within the frame data sequence for each frame;
a fourth rearranging unit for rearranging the elements of the error correcting code word sequences generated by the first coding unit within the error correcting code word sequence for each frame in a procedure which is reverse to that which the third rearranging unit uses; and
a second coding unit for concatenating the error correcting code word sequence generated by the first coding unit and an error correcting code word sequence generated by coding the error correcting code word sequences rearranged by the fourth rearranging unit and the first rearranging unit for each frame,
wherein the first coding unit codes sequences to be coded of the frame data sequences rearranged by the third rearranging unit as the sequences to be coded, and
wherein the first rearranging unit rearranges the elements of the error correcting code word sequences of the plurality of the frames rearranged by the fourth rearranging unit for each frame.

4. An error correction coding apparatus according to claim 1, further comprising:
a frame generating unit for generating a frame data sequence which includes the information source data and corresponds to the error correcting code word sequence for each frame; and
a second rearranging unit for rearranging elements of the frame data sequences of the plurality of the frames generated by the frame generating unit in a procedure which is reverse to that which the first rearranging unit uses,
wherein the first coding unit codes sequences to be coded of the frame data sequences rearranged by the second rearranging unit as the sequences to be coded.

5. An error correction coding apparatus according to claim 4,
wherein the frame generating unit buffers the frame data sequence which includes the information source data for each frame in a frame buffer which corresponds to the error correcting code word sequence for the frame,
wherein the second rearranging unit rearranges the elements of the frame data sequences within the frame buffers for the plurality of the frames buffered by the frame generating unit,
wherein the first coding unit codes the sequences to be coded of the frame data sequences rearranged by the second rearranging unit as the sequences for each of the frame buffers, and buffers the error correcting code word sequence including the parity sequence generated thereby in the frame buffer, and the first rearranging unit rearranges the elements of the error correcting code word sequences within the frame buffers for the plurality of the frames buffered by the first coding unit.

6. An error correction decoding apparatus comprising:
a first rearranging unit for rearranging elements of sequences to be decoded of a plurality of frames, which correspond to error correcting code word sequences of a plurality of frames including parity sequences generated by coding for each frame, and include parity-corresponding sequences corresponding to the parity sequences, wherein
the first rearranging unit rearranges elements of the parity-corresponding sequences included in the sequences to be decoded, within the parity-corresponding sequences on the plurality of frames, and
the first rearranging unit rearranges elements of the sequences to be decoded other than the parity-corresponding sequences, within the sequences to be decoded other than the parity corresponding sequences on the plurality of frames; and
a first decoding unit for decoding the sequences to be decoded of the plurality of frames rearranged by the first rearranging unit for each frame to generate an estimated code word sequence.

7. The error correction decoding apparatus according to claim 6, further comprising a second decoding unit for decoding for each frame the sequences to be decoded of the plurality of frames, which correspond to error correcting code word sequences each obtained by concatenating the error correcting code word sequence and an error correcting code word sequence generated by coding the error correcting code word sequence for the frame, and include the parity-corresponding sequences corresponding to the parity sequences,
wherein the first rearranging unit rearranges elements of the decoding result sequences obtained by the decoding performed by the second decoding unit as elements of the sequences to be decoded.

8. The error correction decoding apparatus according to claim 6, further comprising a second rearranging unit for rearranging elements of the estimated code word sequences of the plurality of frames generated by the first decoding unit in a procedure which is reverse to that which said first rearranging unit uses.

9. An error correction decoding apparatus according to claim 6, further comprising:
a second decoding unit for decoding for each frame the sequences to be decoded of the plurality of frames, which correspond to error correcting code word sequences each obtained by concatenating the error correcting code word sequence and an error correcting code word sequence generated by coding the error correcting code word sequence for the frame, and include the parity-corresponding sequences corresponding to the parity sequences;
a second rearranging unit for rearranging elements of decoding result sequences obtained by the decoding performed by the second decoding unit after the decoding result sequences of the plurality of frames are rearranged by the first rearranging unit, within the decoding result sequences for each frame;
a third rearranging unit for rearranging elements of the estimated code word sequence generated by the first decoding unit within the estimated code word sequence for each frame in a procedure which is reverse to that which the second rearranging unit uses; and
a fourth rearranging unit for rearranging the elements of the estimated code word sequences of the plurality of frames rearranged by the third rearranging unit in a procedure which is reverse to that which the first rearranging unit uses,
wherein the first rearranging unit rearranges the elements of the decoding result sequences obtained by the decoding performed by the second decoding unit as the elements of the sequences to be decoded, and
wherein the first decoding unit decodes for each frame the decoding result sequences of the plurality of frames after being rearranged by the second rearranging unit, to generate the estimated code word sequence.

10. An error correction coding and decoding method of performing error correction coding processing and error correction decoding processing in an error correction coding and decoding system including an error correction coding apparatus and an error correction decoding apparatus, the error correction coding and decoding method comprising:
a first coding step of coding, by the error correction coding apparatus, a sequence to be coded which includes information source data for each frame to generate an error correcting code word sequence including a parity sequence;
a first rearranging step of rearranging, by the error correction coding apparatus, elements of the error correcting code word sequences of a plurality of the frames generated in the first coding step, wherein
the error correction coding apparatus rearranges elements of the parity sequences included in the error correcting code word sequences, within the parity sequences on the plurality of the frames, and
the error correction coding apparatus rearranges elements of the error correcting code word sequences other than the parity sequences, within the error correcting code word sequences other than the parity sequences on the plurality of the frames;
a second rearranging step of rearranging, by the error correction decoding apparatus, elements of sequences to be decoded of a plurality of frames, which correspond to the error correcting code word sequences of the plurality of the frames including the parity sequences generated by the coding for each frame, and include parity-corresponding sequences corresponding to the parity sequences, wherein
the error correction decoding apparatus rearranges elements of the parity-corresponding sequences included in the sequences to be decoded within the parity-corresponding sequences on the plurality of frames, and
the error correction decoding apparatus rearranges elements of the sequences to be decoded other than the parity-corresponding sequences, within the sequences to be decoded other than the parity-corresponding sequences on the plurality of frames; and
a first decoding step of decoding, by the error correction decoding apparatus, the sequences to be decoded of the plurality of frames rearranged in the second rearranging step for each frame to generate an estimated code word sequence.

* * * * *